United States Patent
Xue et al.

(10) Patent No.: US 10,923,652 B2
(45) Date of Patent: Feb. 16, 2021

(54) TOP BUFFER LAYER FOR MAGNETIC TUNNEL JUNCTION APPLICATION

(71) Applicant: Applied Materials, Inc., Santa Clara, CA (US)

(72) Inventors: Lin Xue, San Diego, CA (US); Chando Park, Palo Alto, CA (US); Chi Hong Ching, Santa Clara, CA (US); Jaesoo Ahn, San Jose, CA (US); Mahendra Pakala, Santa Clara, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 16/448,709

(22) Filed: Jun. 21, 2019

(65) Prior Publication Data
US 2020/0403152 A1 Dec. 24, 2020

(51) Int. Cl.
*H01L 43/12* (2006.01)
*H01L 43/02* (2006.01)
*G11C 11/16* (2006.01)
*C23C 14/54* (2006.01)
*H01F 10/32* (2006.01)
(Continued)

(52) U.S. Cl.
CPC ........... *H01L 43/12* (2013.01); *C23C 14/067* (2013.01); *C23C 14/541* (2013.01); *G11C 11/161* (2013.01); *H01F 10/325* (2013.01); *H01F 10/3259* (2013.01); *H01F 41/32* (2013.01); *H01L 43/02* (2013.01); *H01L 43/10* (2013.01); *H01F 10/137* (2013.01); *H01F 10/329* (2013.01); *H01L 21/67167* (2013.01)

(58) Field of Classification Search
CPC ....... H01L 29/82; H01L 27/222; H01L 43/08; G11C 14/0036; G11C 14/0081; G11C 2211/5615; G11C 11/161; H01F 10/13–137; G11B 5/3909
See application file for complete search history.

(56) References Cited

U.S. PATENT DOCUMENTS 6,964,928 B2 11/2005 Ying et al.
7,750,421 B2 7/2010 Horng et al.
(Continued)

FOREIGN PATENT DOCUMENTS

KR 1020160113048 A 9/2016
KR 1020180028879 A 3/2018

OTHER PUBLICATIONS

H Wang, X Kou, S Wang, J Zhou, X Zhang, J Li, "Structures, magnetic properties and thermal stability of CoFeB/MgO films"—Physics Procedia, 2011 pp. 267-273 (Year: 2011).*
(Continued)

Primary Examiner — Sonya McCall-Shepard
(74) Attorney, Agent, or Firm — Patterson + Sheridan, LLP

(57) ABSTRACT

Embodiments of the disclosure provide methods and apparatus for fabricating magnetic tunnel junction (MTJ) structures on a substrate for MRAM applications. In one embodiment, a magnetic tunnel junction (MTJ) device structure includes a junction structure disposed on a substrate, the junction structure comprising a first ferromagnetic layer and a second ferromagnetic layer sandwiching a tunneling barrier layer, a dielectric capping layer disposed on the junction structure, a metal capping layer disposed on the junction structure, and a top buffer layer disposed on the metal capping layer.

17 Claims, 4 Drawing Sheets

(51) Int. Cl.
  *H01L 43/10* (2006.01)
  *H01F 41/32* (2006.01)
  *C23C 14/06* (2006.01)
  *H01L 21/67* (2006.01)
  *H01F 10/13* (2006.01)

(56) References Cited

U.S. PATENT DOCUMENTS

| | | | |
|---|---|---|---|
| 9,028,910 B2 | 5/2015 | Zhou et al. | |
| 9,337,415 B1* | 5/2016 | Oh | H01L 43/08 |
| 10,186,307 B2* | 1/2019 | Lee | G11C 11/161 |
| 2009/0161267 A1* | 6/2009 | Kawai | G11C 11/1673 |
| | | | 360/324.2 |
| 2010/0276768 A1* | 11/2010 | Gaidis | H01L 43/12 |
| | | | 257/421 |
| 2011/0143460 A1* | 6/2011 | Tsunekawa | C23C 14/081 |
| | | | 438/3 |
| 2013/0134032 A1* | 5/2013 | Tsunekawa | B82Y 40/00 |
| | | | 204/192.2 |
| 2014/0038312 A1 | 2/2014 | Lee et al. | |
| 2015/0008547 A1* | 1/2015 | Pi | H01L 43/06 |
| | | | 257/421 |
| 2015/0255507 A1 | 9/2015 | Pakala et al. | |
| 2016/0005953 A1* | 1/2016 | Lee | H01L 43/08 |
| | | | 711/126 |
| 2016/0351799 A1 | 12/2016 | Xue et al. | |
| 2017/0222132 A1 | 8/2017 | Pinarbasi et al. | |
| 2018/0331280 A1 | 11/2018 | Hosoya et al. | |
| 2019/0341542 A1* | 11/2019 | Haq | G11B 19/2009 |
| 2020/0098981 A1 | 3/2020 | Xue et al. | |

OTHER PUBLICATIONS

International Search Report/Written Opinion issued in PCT/US2020/034038 dated Aug. 28, 2020.

* cited by examiner

TOP BUFFER LAYER FOR MAGNETIC TUNNEL JUNCTION APPLICATION

BACKGROUND OF THE DISCLOSURE

Field of the Disclosure

Embodiments of the disclosure generally relate to a fabrication process for forming a top buffer layer on a substrate, and more particularly, for forming a non-magnetic material on a magnetic tunnel junction structure for magnetoresistive random access memory (MRAM) applications.

Description of the Background Art

Magnetoresistive random access memory (MRAM) is a type of memory device containing an array of MRAM cells that store data using their resistance values instead of electronic charges. Generally, each MRAM cell includes a magnetic tunnel junction (MTJ) structure. The MTJ structure may have adjustable resistance to represent a logic state "0" or "1." The MTJ structure typically includes a stack of magnetic layers having a configuration in which two ferromagnetic layers are separated by a thin non-magnetic dielectric, e.g., an insulating tunneling layer. A top electrode and a bottom electrode are utilized to sandwich the MTJ structure so electric current may flow between the top and the bottom electrode.

One ferromagnetic layer, e.g., a reference layer, is characterized by a magnetization with a fixed direction. The other ferromagnetic layer, e.g., a storage layer, is characterized by a magnetization with a direction that is varied upon writing of the device, such as by applying a magnetic field. In some devices, an insulator material, such as a dielectric oxide layer, may be formed as a thin tunneling barrier layer sandwiched between the ferromagnetic layers. The layers are typically deposited sequentially as overlying blanketed films. The ferromagnetic layers and the insulator material are subsequently patterned by various etching processes in which one or more layers are removed, either partially or totally, in order to form a device feature.

When the respective magnetizations of the reference layer and the storage layer are antiparallel, a resistance of the magnetic tunnel junction is high having a resistance value $R_{max}$ corresponding to a high logic state "1". On the other hand, when the respective magnetizations are parallel, the resistance of the magnetic tunnel junction is low, namely having a resistance value $R_{min}$ corresponding to a low logic state "0". A logic state of a MRAM cell is read by comparing its resistance value to a reference resistance value $R_{ref}$, which is derived from a reference cell or a group of reference cells and represents an in-between resistance value between that of the high logic state "1" and the low logic state "0".

While manufacturing conventional magnetic tunnel junction (MTJ) structure, multiple materials are required to be stacked. However, such materials may have different film properties, resulting in poor interface control and management, and eventually leading to film peeling or insufficient crystallization of the ferromagnetic layers in the following manufacturing process. Poor interface control may cause the film bonding structures or properties formed in an undesirable manner, such as insufficient crystallization of the film layer, thus leading to failure of the device to meet its intended performance.

Therefore, there is a need in the art for improved methods and apparatus for fabricating MTJ structures for MRAM applications.

SUMMARY OF THE DISCLOSURE

Embodiments of the disclosure provide methods and apparatus for fabricating magnetic tunnel junction (MTJ) structures on a substrate for MRAM applications. In one embodiment, a magnetic tunnel junction (MTJ) device structure includes a junction structure disposed on a substrate, the junction structure comprising a first ferromagnetic layer and a second ferromagnetic layer sandwiching a tunneling barrier layer, a dielectric capping layer disposed on the junction structure, a metal capping layer disposed on the junction structure, and a top buffer layer disposed on the metal capping layer.

In another embodiment, a method for forming a magnetic tunnel junction (MTJ) device structure includes forming a film stack on a substrate, wherein the junction structure comprises a first ferromagnetic layer and a second ferromagnetic layer sandwiching a tunneling barrier layer, forming a dielectric capping layer on the junction structure, and forming a cooling process on the substrate.

In yet another embodiment, a method for forming a magnetic tunnel junction (MTJ) device structure includes forming a film stack on a substrate, wherein the junction structure comprises a first ferromagnetic layer and a second ferromagnetic layer sandwiching a tunneling barrier layer, forming a dielectric capping layer on the junction structure, forming a cooling process on the substrate, forming a metal capping layer on the dielectric capping layer, and forming a non-magnetic layer on the metal capping layer.

BRIEF DESCRIPTION OF THE DRAWINGS

So that the manner in which the above recited features of the present disclosure are attained and can be understood in detail, a more particular description of the disclosure, briefly summarized above, may be had by reference to the embodiments thereof which are illustrated in the appended drawings.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this disclosure and are therefore not to be considered limiting of its scope, for the disclosure may admit to other equally effective embodiments.

DETAILED DESCRIPTION

Embodiments of the disclosure generally provide an apparatus and methods for forming a MTJ structure disposed on a substrate for MRAM applications. In one embodiment, the MTJ structure as described herein has a top buffer layer disposed on a metal capping layer on a dielectric capping layer in the MTJ structure. After the dielectric capping layer is formed in the MTJ structure, a cooling process is performed on the dielectric capping layer so as to enhance and control the lattice structure of the metal capping layer subsequently formed thereon.

Figure 1:
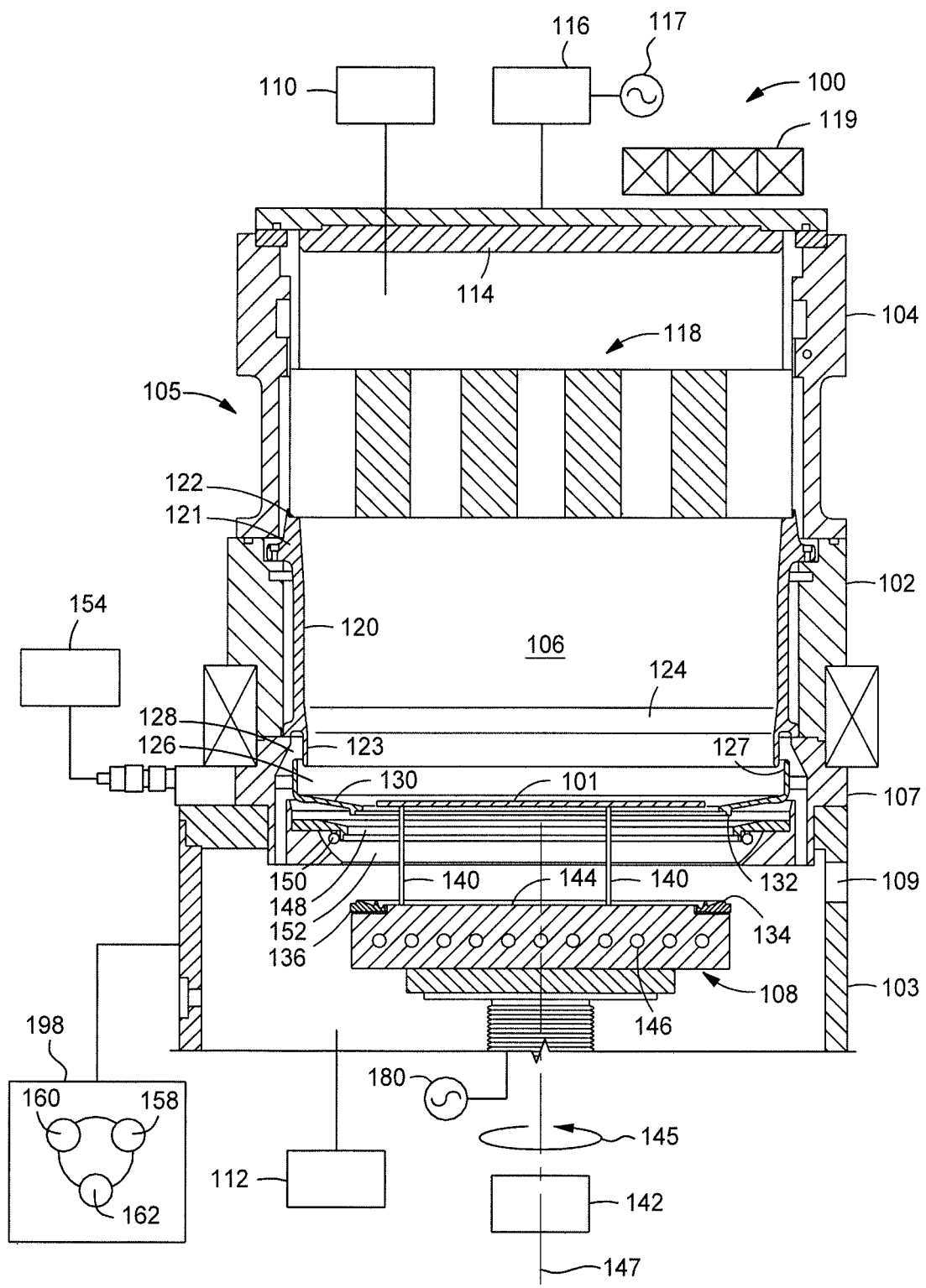
FIG. 1 depicts one embodiment of a deposition chamber for practice one embodiment of the present disclosure.

FIG. 1 illustrates an exemplary physical vapor deposition (PVD) chamber 100 (e.g., a sputter process chamber) suitable for sputter depositing materials according to one embodiment of the disclosure. Examples of suitable PVD chambers include the ALPS® Plus and SIP ENCORE® PVD processing chambers, both commercially available from Applied Materials, Inc., Santa Clara, of California. It is contemplated that processing chambers available from other manufactures may also be adapted to perform the embodiments described herein.

FIG. 1 is a schematic cross-sectional view of a deposition chamber 100 according to one embodiment. The deposition chamber 100 has an upper sidewall 102, a lower sidewall 103, and a lid portion 104 defining a body 105 that encloses an interior volume 106 thereof. An adapter plate 107 may be disposed between the upper sidewall 102 and the lower sidewall 103.

A substrate support, such as a pedestal 108, is disposed in the interior volume 106 of the deposition chamber 100. The substrate pedestal 108 may be rotatable, as indicated by the arrow 145, along an axis 147, where a shaft 143 of the substrate pedestal 108 is located. Alternatively, the substrate support pedestal 108 may be lifted up to rotate as necessary during a deposition process.

A substrate transfer port 109 is formed in the lower sidewall 103 for transferring substrates into and out of the interior volume 106.

In one embodiment, the deposition chamber 100 comprises a sputtering chamber, also known as a physical vapor deposition (PVD) chamber, capable of depositing, for example, titanium, aluminum oxide, aluminum, aluminum nitride, scandium doped aluminum nitride, aluminum oxynitride, lead zirconate titanate (PZT), potassium sodium niobate (KNN), lithium niobate, copper, tantalum, tantalum nitride, tantalum oxynitride, titanium oxynitride, tungsten, or tungsten nitride on a substrate, such as the substrate 101.

A gas source 110 is coupled to the deposition chamber 100 to supply process gases into the interior volume 106. In one embodiment, process gases may include inert gases, non-reactive gases, and reactive gases if necessary. Examples of process gases that may be provided by the gas source 110 include, but not limited to, argon gas (Ar), helium (He), neon gas (Ne), nitrogen gas ($N_2$) and oxygen gas ($O_2$), among others.

A pumping device 112 is coupled to the deposition chamber 100 in communication with the interior volume 106 to control the pressure of the interior volume 106. In one embodiment, the pressure level of the deposition chamber 100 may be maintained at about 1 Torr or less. In another embodiment, the pressure level of the deposition chamber 100 may be maintained at about 500 milliTorr or less. In yet another embodiment, the pressure level of the deposition chamber 100 may be maintained at about 1 milliTorr and about 300 milliTorr.

The lid portion 104 may support a sputtering source 114, such as a target. In one embodiment, the sputtering source 114 may be fabricated from a material containing titanium (Ti), tantalum (Ta), ruthenium (Ru), iridium (Ir), iron (Fe), magnesium (Mg), tungsten (W), cobalt (Co), nickel (Ni), copper (Cu), aluminum (Al), zirconium (Zr), niobium (Nb), scandium (Sc), alloys thereof, combinations thereof, or the like. In an exemplary embodiment depicted herein, the sputtering source 114 may be fabricated by ruthenium (Ru), iridium (Ir), iron (Fe), magnesium (Mg) or cobalt (Co).

The sputtering source 114 may be coupled to a source assembly 116 comprising a power supply 117 for the sputtering source 114. A set of magnet 119 may be coupled adjacent to the sputtering source 114 which enhances efficient sputtering materials from the sputtering source 114 during processing. Examples of the magnetron assembly include an electromagnetic linear magnetron, a serpentine magnetron, a spiral magnetron, a double-digitated magnetron, a rectangularized spiral magnetron, among others.

An additional RF power source 180 may also be coupled to the deposition chamber 100 through the pedestal 108 (or called substrate support) to provide a bias power between the sputtering source 114 and the pedestal 108 as needed. In one embodiment, the RF power source 180 may have a frequency between about 1 MHz and about 100 MHz, such as about 13.56 MHz.

A collimator 118 may be positioned in the interior volume 106 between the sputtering source 114 and the pedestal 108. A shield tube 120 may be in proximity to the collimator 118 and interior of the lid portion 104. The collimator 118 includes a plurality of apertures to direct gas and/or material flux within the interior volume 106. The collimator 118 may be mechanically and electrically coupled to the shield tube 120. In one embodiment, the collimator 118 is mechanically coupled to the shield tube 120, such as by a welding process, making the collimator 118 integral to the shield tube 120. In another embodiment, the collimator 118 may be electrically floating within the chamber 100. In another embodiment, the collimator 118 may be coupled to an electrical power source and/or electrically coupled to the lid portion 104 of the body 105 of the deposition chamber 100.

The shield tube 120 may include a tubular body 121 having a recess 122 formed in an upper surface thereof. The recess 122 provides a mating interface with a lower surface of the collimator 118. The tubular body 121 of the shield tube 120 may include a shoulder region 123 having an inner diameter that is less than the inner diameter of the remainder of the tubular body 121. In one embodiment, the inner surface of the tubular body 121 transitions radially inward along a tapered surface 124 to an inner surface of the shoulder region 123. A shield ring 126 may be disposed in the chamber 100 adjacent to the shield tube 120 and intermediate of the shield tube 120 and the adapter plate 107. The shield ring 126 may be at least partially disposed in a recess 128 formed by an opposing side of the shoulder region 123 of the shield tube 120 and an interior sidewall of the adapter plate 107.

In one aspect, the shield ring 126 includes an axially projecting annular sidewall 127 that includes an inner diameter that is greater than an outer diameter of the shoulder region 123 of the shield tube 120. A radial flange 130 extends from the annular sidewall 127. The radial flange 130 may be formed at an angle greater than about ninety degrees (90°) relative to the inside diameter surface of the annular sidewall 127 of the shield ring 126. The radial flange 130 includes a protrusion 132 formed on a lower surface thereof. The protrusion 132 may be a circular ridge extending from the surface of the radial flange 130 in an orientation that is substantially parallel to the inside diameter surface of the annular sidewall 127 of the shield ring 126. The protrusion 132 is generally adapted to mate with a recessed flange 134 formed in an edge ring 136 disposed on the pedestal 108.

The recessed flange 134 may be a circular groove formed in the edge ring 136. The engagement of the protrusion 132 and the recessed flange 134 centers the shield ring 126 with respect to the longitudinal axis of the pedestal 108. The substrate 101 (shown supported on lift pins 140) is centered relative to the longitudinal axis of the pedestal 108 by coordinated positioning calibration between the pedestal 108 and a robot blade (not shown). In this manner, the substrate 101 may be centered within the deposition chamber 100 and the shield ring 126 may be centered radially about the substrate 101 during processing.

In operation, a robot blade (not shown) having a substrate 101 thereon is extended through the substrate transfer port 109. The pedestal 108 may be lowered to allow the substrate 101 to be transferred to the lift pins 140 extending from the pedestal 108. Lifting and lowering of the pedestal 108 and/or the lift pins 140 may be controlled by a drive 142 coupled to the pedestal 108. The substrate 101 may be lowered onto a substrate receiving surface 144 of the pedestal 108. With the substrate 101 positioned on the substrate receiving surface 144 of the pedestal 108, sputter depositions may be performed on the substrate 101. The edge ring 136 may be electrically insulated from the substrate 101 during processing. Therefore, the substrate receiving surface 144 may include a height that is greater than a height of portions of the edge ring 136 adjacent the substrate 101 such that the substrate 101 is prevented from contacting the edge ring 136. During sputter deposition, the temperature of the substrate 101 may be controlled by utilizing thermal control channels 146 disposed in the pedestal 108.

After sputter deposition, the substrate 101 may be elevated utilizing the lift pins 140 to a position that is spaced away from the pedestal 108. The elevated location may be proximate one or both of the shield ring 126 and a reflector ring 148 adjacent to the adapter plate 107. The adapter plate 107 includes one or more lamps 150 coupled thereto intermediate of a lower surface of the reflector ring 148 and a concave surface 152 of the adapter plate 107. The lamps 150 provide optical and/or radiant energy in the visible or near visible wavelengths, such as in the infra-red (IR) and/or ultraviolet (UV) spectrum. The energy from the lamps 150 is focused radially inward toward the backside (i.e., lower surface) of the substrate 101 to heat the substrate 101 and the material deposited thereon. Reflective surfaces on the chamber components surrounding the substrate 101 serve to focus the energy toward the backside of the substrate 101 and away from other chamber components where the energy would be lost and/or not utilized. The adapter plate 107 may be coupled to a coolant source 154 to control the temperature of the adapter plate 107 during heating.

After controlling the substrate 101 to the desired temperature, the substrate 101 is lowered to a position on the substrate receiving surface 144 of the pedestal 108. The substrate 101 may be rapidly cooled utilizing the thermal control channels 146 in the pedestal 108 via conduction. The temperature of the substrate 101 may be ramped down from the first temperature to a second temperature in a matter of seconds to about a minute. The substrate 101 may be removed from the deposition chamber 100 through the substrate transfer port 109 for further processing. The substrate 101 may be maintained at a desired temperature range, such as less than 250 degrees Celsius as needed.

A controller 198 is coupled to the process chamber 100. The controller 198 includes a central processing unit (CPU) 160, a memory 158, and support circuits 162. The controller 198 is utilized to control the process sequence, regulating the gas flows from the gas source 110 into the deposition chamber 100 and controlling ion bombardment of the sputtering source 114. The CPU 160 may be of any form of a general purpose computer processor that can be used in an industrial setting. The software routines can be stored in the memory 158, such as random access memory, read only memory, floppy or hard disk drive, or other form of digital storage. The support circuits 162 are conventionally coupled to the CPU 160 and may comprise cache, clock circuits, input/output subsystems, power supplies, and the like. The software routines, when executed by the CPU 160, transform the CPU into a specific purpose computer (controller) 198 that controls the deposition chamber 100 such that the processes are performed in accordance with the present disclosure. The software routines may also be stored and/or executed by a second controller (not shown) that is located remotely from the chamber 100.

During processing, material is sputtered from the sputtering source 114 and deposited on the surface of the substrate 101. The sputtering source 114 and the substrate support pedestal 108 are biased relative to each other by the power supply 117 or 180 to maintain a plasma formed from the process gases supplied by the gas source 110. The ions from the plasma are accelerated toward and strike the sputtering source 114, causing target material to be dislodged from the sputtering source 114. The dislodged target material and process gases form a metal containing layer on the substrate 101 with a desired composition.

Figure 2:
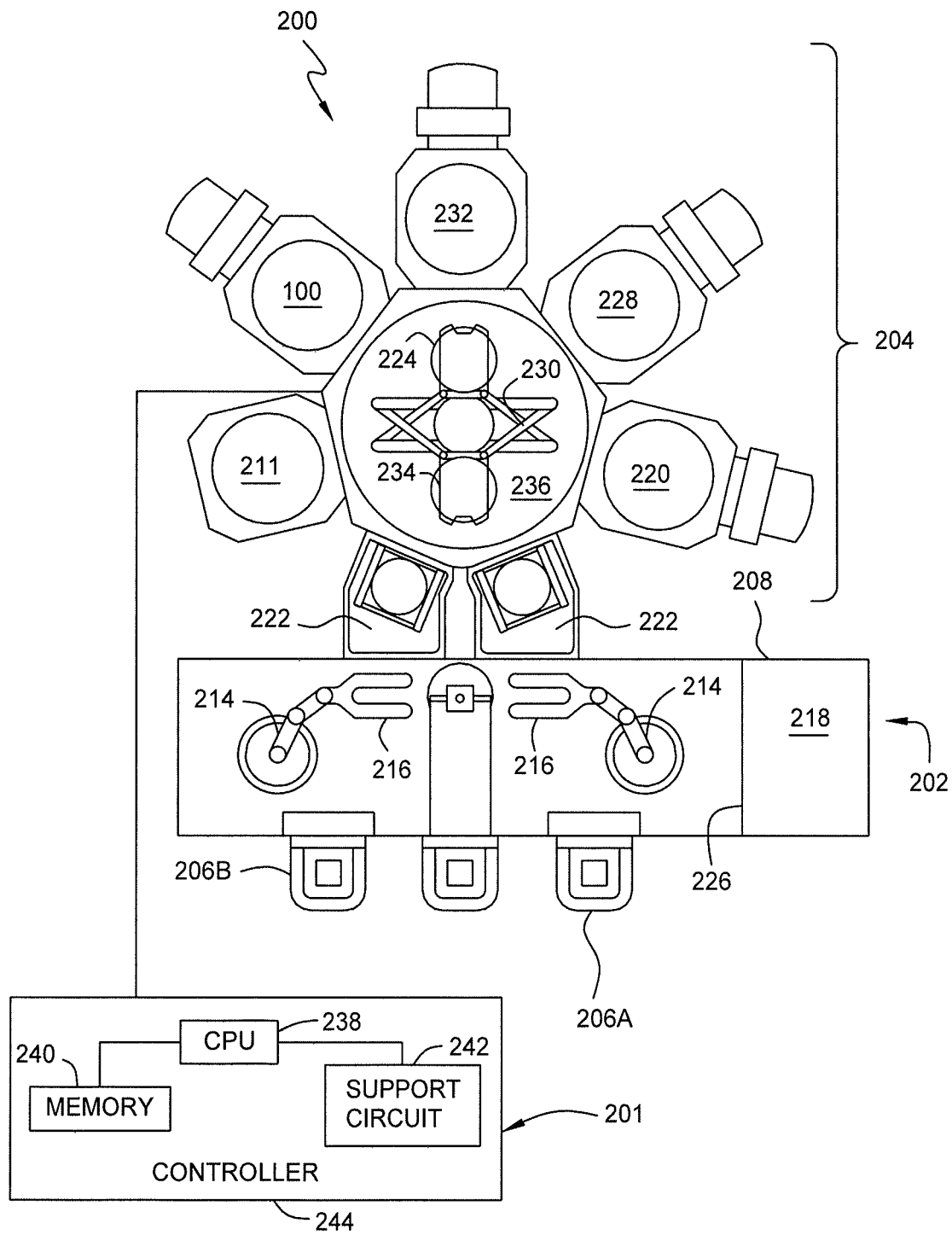
FIG. 2 depicts another embodiment of a cluster processing system for practice one embodiment of the present disclosure.

FIG. 2 is a schematic, top plan view of an exemplary cluster processing system 200 that includes one or more of the processing chambers 211, 100, 232, 228, 220 that are incorporated and integrated therein. In one embodiment, the cluster processing system 200 may be a CENTURA® or ENDURA® integrated processing system, commercially available from Applied Materials, Inc., located in Santa Clara, Calif. It is contemplated that other processing systems (including those from other manufacturers) may be adapted to benefit from the disclosure.

The cluster processing system 200 includes a vacuum-tight processing platform 204, a factory interface 202, and a system controller 244. The platform 204 includes a plurality of processing chambers 211, 100, 232, 228, 220 and at least one load-lock chamber 222 that is coupled to a vacuum substrate transfer chamber 236. Two load lock chambers 222 are shown in FIG. 2. The factory interface 202 is coupled to the transfer chamber 236 by the load lock chambers 222.

In one embodiment, at least one of the processing chambers, such as the chamber 211, is a cooling chamber. The cooling chamber 211 may control the temperature of the substrate 101 positioned therein. In one example, the cooling chamber 211 may control the temperature of the substrate 101 down to a range between about negative 250 degrees Celsius (e.g., −250° C.). and about negative 100 degrees Celsius (e.g., −100° C.). The cooling chamber 211 can generally control the temperature of the substrate 101 disposed therein between about negative 250 degrees Celsius (e.g., −300° C.). to about 50 degrees Celsius (e.g., 50° C.).

In one embodiment, the factory interface 202 comprises at least one docking station 208 and at least one factory interface robot 214 to facilitate transfer of substrates. The docking station 208 is configured to accept one or more front opening unified pod (FOUP). Two FOUPS 206A-B are shown in the embodiment of FIG. 2. The factory interface robot 214 having a blade 216 disposed on one end of the robot 214 is configured to transfer the substrate from the factory interface 202 to the processing platform 204 for processing through the load lock chambers 222. Optionally, one or more metrology stations 218 may be connected to a terminal 226 of the factory interface 202 to facilitate measurement of the substrate from the FOUPS 206A-B.

Each of the load lock chambers 222 have a first port coupled to the factory interface 202 and a second port coupled to the transfer chamber 236. The load lock chambers 222 are coupled to a pressure control system (not shown) which pumps down and vents the load lock chambers 222 to facilitate passing the substrate between the vacuum environment of the transfer chamber 236 and the substantially ambient (e.g., atmospheric) environment of the factory interface 202.

The transfer chamber 236 has a vacuum robot 230 disposed therein. The vacuum robot 230 has a blade 234 capable of transferring substrates 224 among the load lock chambers 222, the metrology system 210 and the processing chambers 211, 100, 232, 228, 220.

In one embodiment of the cluster processing system 200, the cluster processing system 200 may include one or more processing chambers 211, 100, 232, 228, 220, which may be a deposition chamber (e.g., physical vapor deposition chamber, chemical vapor deposition, or other deposition chambers), annealing chamber (e.g., high pressure annealing chamber, RTP chamber, laser anneal chamber), a cooling chamber or a treatment chamber that can heat or cool the substrate, etch chamber, orientation chamber that can rotate the substrate, a cleaning chamber, curing chamber, lithographic exposure chamber, or other similar type of semiconductor processing chambers. In some embodiments of the cluster processing system 200, one or more of processing chambers 211, 100, 232, 228, 220, the transfer chamber 236, the factory interface 202 and/or at least one of the load lock chambers 222. In one example, the processing chambers 211, 100, 232, 228, 220 in the cluster processing system 200 comprises at least one physical vapor deposition chamber, such as deposition chamber 100, and one cooling chamber, such as the cooling chamber 211.

The system controller 244 is coupled to the cluster processing system 200. The system controller 244, which may include the computing device 201 or be included within the computing device 201, controls the operation of the cluster processing system 200 using a direct control of the process chambers 211, 100, 232, 228, 220 of the cluster processing system 200. Alternatively, the system controller 244 may control the computers (or controllers) associated with the process chambers 211, 100, 232, 228, 220 and the cluster processing system 200. In operation, the system controller 244 also enables data collection and feedback from the respective chambers to optimize performance of the cluster processing system 200.

The system controller 244, much like the computing device 201 described above, generally includes a central processing unit (CPU) 238, a memory 240, and support circuits 242. The CPU 238 may be one of any form of a general purpose computer processor that can be used in an industrial setting. The support circuits 242 are conventionally coupled to the CPU 238 and may comprise cache, clock circuits, input/output subsystems, power supplies, and the like. The software routines transform the CPU 238 into a specific purpose computer (controller) 244. The software routines may also be stored and/or executed by a second controller (not shown) that is located remotely from the cluster processing system 200.

Figure 3:
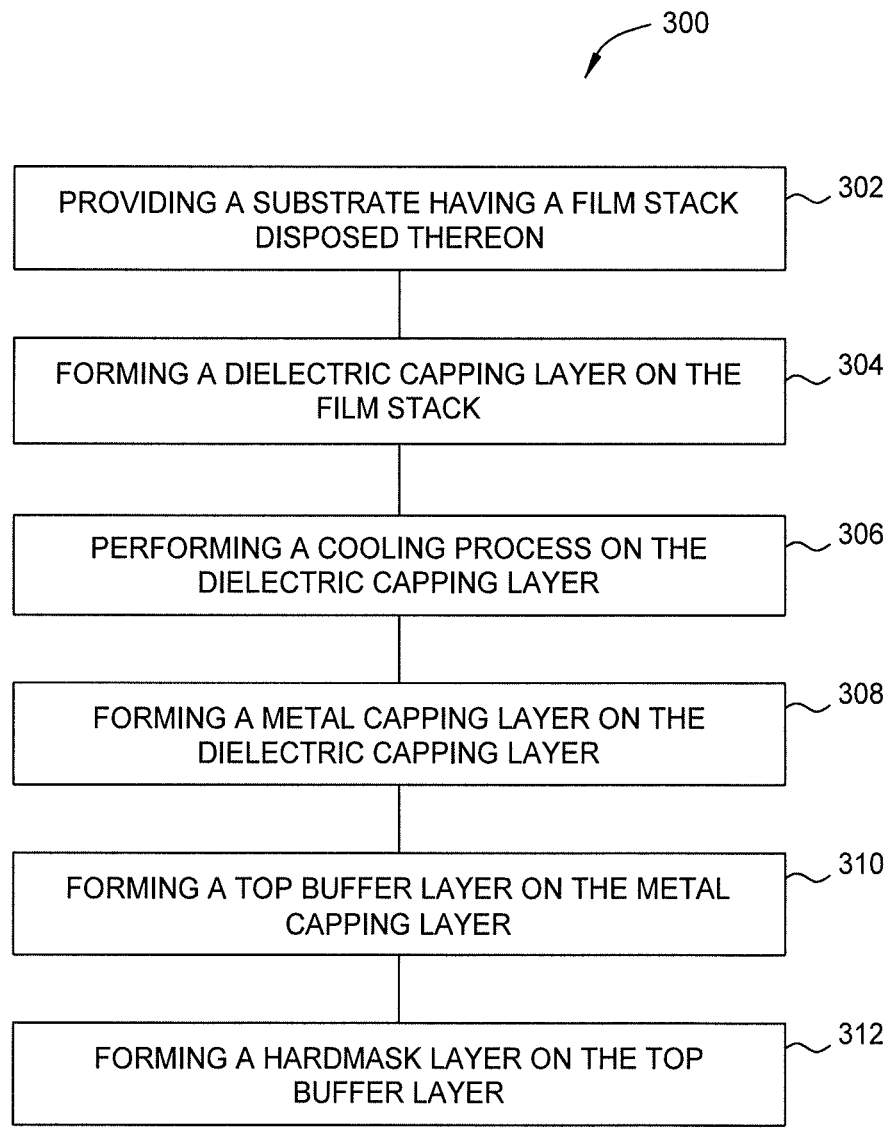
FIG. 3 depicts a flow diagram illustrating a method for fabricating magnetic tunnel junction (MTJ) structures according to one embodiment of the present disclosure.
Figure 4:
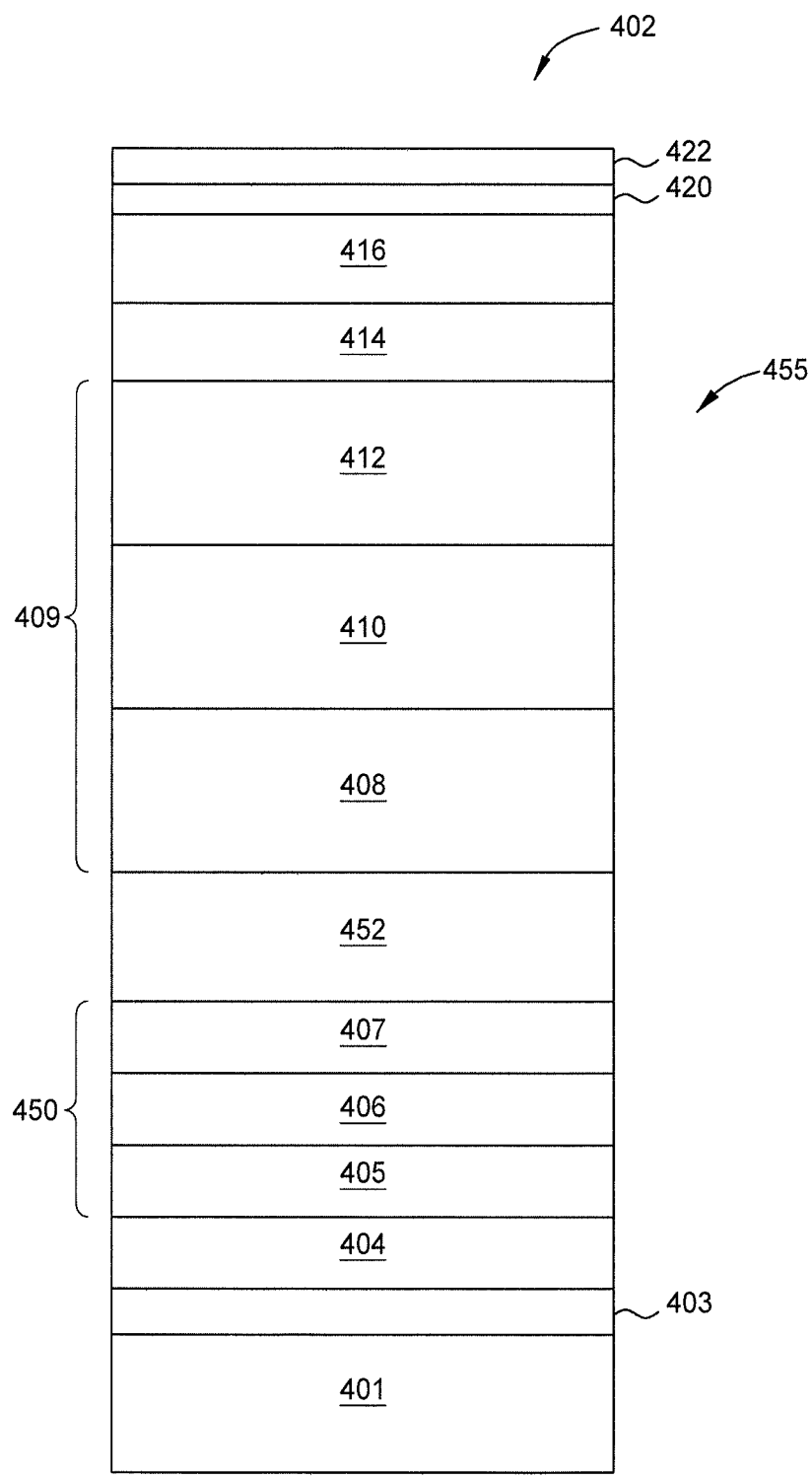
FIG. 4 is a cross sectional view of a substrate with the magnetic tunnel junction (MTJ) structure fabricated from the method of FIG. 3.

FIG. 3 depicts a flow diagram illustrating a process 300 for manufacturing MTJ structures on a substrate for MRAM applications according to one embodiment of the present disclosure. It is noted that the process 300 for manufacturing MTJ structures may be utilized in spin-orbit-torque magnetic random access memory (SOT MRAM), spin-transfer-torque magnetic random access memory (STT MRAM), and/or the hybrid (or called integrated) spin-orbit-torque magnetic spin-transfer-torque magnetic random access memory (SOT-STT MRAM) applications, particularly in spin-orbit-torque magnetic random access memory (SOT MRAM). FIG. 4 is schematic a cross-sectional view of MTJ structure formed on a substrate 401 manufactured from the process 300 of FIG. 3. It is contemplated that the process 300 may be performed in suitable processing chambers, such as the plasma processing chamber 100 depicted in FIG. 1 or the cooling chamber 211 depicted in FIG. 2, both incorporated in the cluster processing systems 200 depicted in FIG. 2. It is also noted that the process 300 may be performed in other suitable processing chambers, including those from other manufacturers.

The process 300 begins at operation 302 by providing a substrate, such as the substrate 401 having a film stack 455 disposed on the substrate 401, that may be utilized to form a MTJ structure 402, as shown in FIG. 4. The substrate 401 may comprise metal or glass, silicon, dielectric bulk material and metal alloys or composite glass, crystalline silicon (e.g., Si<100> or Si<111>), silicon oxide, strained silicon, silicon germanium, germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, or sapphire. The base may have various dimensions, such as 200 mm, 300 mm, 450 mm or other diameter, as well as, being a rectangular or square panel. Unless otherwise noted, examples described herein are conducted on substrates with a 200 mm diameter, a 300 mm diameter, or a 450 mm diameter base substrate.

The magnetic tunnel junction (MTJ) 402 includes the film stack 455 having a junction structure 409, which includes a first ferromagnetic layer 412 and a second ferromagnetic layer 408 sandwiching a tunneling barrier layer 410. The film stack 455 further includes a bottom buffer layer 403, a seed layer 404 and a pinning layer 450 and a blocking layer 452 formed under the junction structure 409. In one example, the materials may be utilized to form the bottom buffer layer 403 including CoFeB, Ta, TaN, W and WN. The seed layer 404 may be fabricated from NiCr, Cr, CoFeB, Ta, Ru, alloys or combinations thereof. The pinning layer 450 may comprise one or more of several types of pinning layers 405, 406, 407, such as a simple pinned, antiparallel pinned, self-pinned or antiferromagnetic pinned sensor. In one example depicted in FIG. 4, the pinning layer 450 includes multiple layers 405, 406, 407, such as three layers. It is noted that the number of the pinning layer 450 may be in any number as needed. The pinning layer 450 may be constructed of several magnetic materials such as a metal alloy with dopants, such as boron dopants, oxygen dopants or other suitable materials. Metal alloys may be a nickel containing material, platinum containing material, Ru containing material, a cobalt containing material, tantalum containing materials and palladium containing materials. In the example depicted in FIG. 4, the pinning layer 450 includes a first pinning layer 405 and a second pinning layer 407 sandwiching a coupling layer 406. Suitable examples of the first and the second pinning layers 405, 407 and the coupling layer 406 include magnetic materials that may comprise one or more of Ru, Ta, Co, Pt, TaN, NiFeO$_x$, NiFeB, CoFeO$_x$B, CoFeB, CoFe, NiO$_x$B, CoBO$_x$, FeBO$_x$, CoFeNiB, CoPt, CoPd, TaO$_x$ and the like. In one example, the first and the second pinning layers 405, 407 are fabricated from Co, Pt, Ni, Ir, and/or Pd and the coupling layer 406 is fabricated from Ir, Ru, Ta, W, Mo, alloys thereof, or combinations thereof.

The junction structure 409 further includes a magnetic storage layer 412 and a magnetic reference layer 408 sandwiching a tunneling barrier layer 410. The tunneling barrier layer 410 may be an oxide barrier layer in the case of a tunnel junction magnetoresistive (TMR) sensor or a conductive layer in the case of a giant magnetoresistive (GMR) sensor. When the magnetic tunnel junction (MTJ) 402 is configured to form a TMR sensor, then the tunneling barrier layer 410 may comprise one or more of MgO, $HfO_2$, $TiO_2$, $TaO_x$, $Al_2O_3$, or other suitable materials. In the embodiment depicted in FIG. 4, the tunneling barrier layer 410 may comprise MgO having a thickness of about 1 to about 15 Angstroms, such about 10 Angstroms.

The magnetic storage layer 412 and the magnetic reference layer 408 may be a metal containing material or a magnetic material, such as one or more of Mo, Ir, Ru, Ta, MgO, Hf, CoFe, CoFeB and the like. It is noted that the magnetic storage layer 412 and the magnetic reference layer 408 may be fabricated from the same or different materials as needed.

At operation 304, a dielectric capping layer 414 is formed on the junction structure 409. The dielectric capping layer 414 is a dielectric layer that may provide an insulation structure from the junction structure 409 to the layers later formed thereon. In one example, the dielectric capping layer 414 is a metal containing dielectric layer, such as MgO. The dielectric capping layer 414 is formed from suitable deposition techniques, such as PVD, CVD, or the like. In one example, the dielectric capping layer 414 is formed from a physical vapor deposition (e.g., a sputtering process) performed in the processing chamber 100 depicted in FIG. 1.

The dielectric capping deposition process may be performed by supplying a deposition gas mixture to the deposition chamber 100 for processing, a voltage power is supplied to the sputtering source 114 (e.g., target) to sputter material that forms the dielectric capping layer 414. For example, voltage power supplied to a Mg target sputters the metal Mg source material from the sputtering source 114 in form of magnesium ions, such as $Mg^{2+}$ that may react with the reacting elements from the deposition gas mixture, so as to form the desired MgO as the dielectric capping layer 414. The bias power applied between the sputtering source 114 and the substrate support pedestal 108 maintains a plasma formed from the gas mixture in the process chamber 100. The ions mainly from the gas mixture in the plasma bombard and sputter off material from the sputtering source 114. The gas mixture and/or other process parameters may be varied during the sputtering deposition process, to form the dielectric capping layer 414 with desired film properties for different film quality requirements.

During processing, several process parameters may be regulated. In one embodiment, a RF source power may be supplied between about 100 Watts and about 20000 Watts. A RF bias power may be applied to the substrate support between about 50 Watts and about 5000 Watts. The substrate temperature may be maintained between about 150 degrees Celsius and about 450 degrees Celsius.

At operation 306, after the dielectric capping layer 414 is formed on the junction structure 409, a cooling process is performed on the substrate 401. The cooling process may be performed in the cooling chamber 211 incorporated in the system 200 so that the processes at operation 304 and operation 306 (e.g., the deposition process and the cooling process) may be performed in a predetermined order and sequence without breaking vacuum so that the substrate 401 may be maintained under vacuum in the processing system 200 when transferring the substrate 401 from the deposition chamber 100 to the cooling chamber 211.

In one embodiment, the substrate 401 is transferred to the cooling chamber 211 to perform a cooling process so as to lower the substrate temperature to a predetermined range. It is believed that the cooling process performed on the substrate may cause the rapid temperature decline on the substrate so that the film properties of the film layers, including the dielectric capping layer 414 and the layers in the junction structure 409, on the substrate 401 may be altered to a relatively more stable manner so that lattice structures in these film layers may have minimum impact during the subsequent deposition processes. For example, it is believed the cooling process as performed on the surface of the dielectric capping layer 414 as well as on the film stack 455 may assist reconstructing the lattice structures thereof in a more stable manner. As a result, when the dielectric capping layer 414 and the film stack 455 undergo the thermal energy from the subsequent deposition processes, the lattice structure of the dielectric capping layer 414 and the film stack 455 may maintain at the desired stable manner without significant lattice structure alternation.

Furthermore, as the stable status of the dielectric capping layer 414 and the film stack 455 may also assist maintaining the stable status of the metal capping layer 416 subsequently formed thereon during its deposition process. For example, the stable status of the dielectric capping layer 414 and the film stack 455 may also assist maintaining the amorphous status of the metal capping layer 416 subsequently formed thereon when the metal capping layer 416 is formed as an amorphous structure.

In one embodiment, the cooling process is performed in the cooling chamber 211 by maintaining the substrate temperature at a range between about negative 50 degrees Celsius (−50° C.) and about negative 250 degrees Celsius (−250° C.), such as between about negative 100 degrees Celsius (−100° C.) and about negative 250 degrees Celsius (−250° C.). The substrate 401 may be positioned on a substrate support in the processing chamber 211 that can quench the substrate temperature to the range between about negative 50 degrees Celsius (−100° C.) and about negative 250 degrees Celsius (−250° C.). The substrate support in the cooling chamber 211 may have a cooling element, such as a condenser, a cooling member or a liquid nitrogen supplier, that can assist rapidly reducing the substrate temperature to the desired low temperature range.

In one embodiment, the cooling process may be performed for between about 50 seconds and about 600 seconds.

At operation 308, after the cooling process, a metal capping layer deposition process is performed to form the metal capping layer 416 on the dielectric capping layer 414. The metal capping layer 416 may be a metal material formed by a PVD process performed in a processing chamber, such as the PVD chamber 100 depicted in FIG. 1. Thus, after the cooling process at operation 306 in the cooling chamber 211, the substrate 401 is then transferred from the cooling chamber 211 back to the processing chamber 100 incorporated in the processing system 200 without breaking vacuum for forming the metal capping layer 416.

In one example, the metal capping layer 416 is a ruthenium (Ru), iridium (Ir), combinations thereof, or alloys thereof. The metal capping layer 416 may be formed by supplying a gas mixture to the processing chamber 100 for processing, a voltage power is supplied to the sputtering source 114 (e.g., target) to sputter material that forms the metal capping layer 416. For example, voltage power supplied to an Ru or Ir target sputters the metal Ru or Ir source material from the sputtering source 114 in form of magnesium ions that may be absorbed on the substrate to form the metal capping layer 416. The bias power applied between the sputtering source 114 and the substrate support pedestal 108 maintains a plasma formed from the gas mixture in the process chamber 100. The ions mainly from the gas mixture in the plasma bombard and sputter off material from the sputtering source 114. The gas mixture and/or other process parameters may be varied during the sputtering deposition process, to form the metal capping layer 416 with desired film properties for different film quality requirements.

During processing, several process parameters may be regulated. In one embodiment, a RF source power may be supplied between about 100 Watts and about 20000 Watts. A RF bias power may be applied to the substrate support between about 50 Watts and about 5000 Watts. The substrate temperature may be maintained between about 150 degrees Celsius and about 450 degrees Celsius.

At operation 310, a top buffer layer 420 is formed on the metal capping layer 416. The top buffer layer 420 assists blocking the film texture, roughness, or other undesired interface effect from the top hardmask layer 422, which will be later formed thereon. The top buffer layer 420 may effectively serve as buffer and/or barrier structure so as to reduce the interference from the nearby layers, such as the top hardmask layer 422 to the underlying metal capping layer 416 during the deposition process. While forming the MTJ structure 402, an annealing process may be performed during different manufacturing processes of forming the film layers in the MTJ structure 402. The annealing process may assist crystallizing the film layers in the MTJ structure 402 to form a desired lattice structure. Thus, the top buffer layer 420 as formed may assist reducing the texture, bonding or lattice structure inference from the top hardmask layer 422 to the underlying metal capping layer 416 or other nearby layers during the annealing process as performed, if any.

In one embodiment, the top buffer layer 420 may be a non-magnetic material. The non-magnetic material provides a film property different from the film property of the metal capping layer 420 or the magnetic storage layer 412 so that the likelihood of the continuing growth of the grain boundaries and/or grain structures from the underlying metal capping layer 420 or the magnetic storage layer 412 may be effectively reduced and minimized when undergoing a thermal process. As a result, the top hardmask layer 422 may maintain its film integrity and provides a good etching mask performance as well as etching selectivity when patterning and manufacturing the MTJ structure 402.

In one example, the non-magnetic material selected for the top buffer layer 420 may be a dielectric material, a metal containing dielectric layer or an insulating material with or without metal elements. The non-magnetic material is selected for the top buffer layer 420 to be incompatible with the magnetic materials from the underlying metal capping layer 420 and/or the magnetic storage layer 412, thus enhancing the barrier and blocking performance between the top hardmask layer 422 and the metal capping layer 420 or the magnetic storage layer 412 (e.g., non-magnetic material vs. magnetic material).

In one example, the top buffer layer 420 is a metal containing material, such as a CoFeB material. The dopant concentration of the boron (B) element in the CoFeB material is selected so that the resultant top buffer layer 420 may stay non-magnetic. In one embodiment, the boron dopant concentration by atomic weight in the material is between about 20% and about 40%, such as about 25%. The controlled boron dopant concentration of the CoFeB material may assist maintaining the top buffer layer 420 an amorphous structure. The amorphous structure of the top buffer layer 420 may also block the texture interference from the top hardmask layer 422 to the underlying metal capping layer 420 and/or the magnetic storage layer 412. The thickness of the top buffer layer 420 is controlled at between about 60 nm and about 120 nm.

In one example, the top buffer layer 420 may also be formed in the processing chamber 100 of FIG. 1, after the deposition process of the metal capping layer 420. Thus, the top buffer layer 420 may be conformed continuously after the metal capping layer 420 in the same chamber, or a different chamber also incorporated in the processing system 200 depicted in FIG. 2. In one embodiment, the top buffer layer 420 is formed by supplying a gas mixture to the processing chamber 100 for processing, a voltage power is supplied to the sputtering source 114 (e.g., target) to sputter material that forms the metal capping layer 416. For example, voltage power supplied to an CoFe alloy target sputters the metal CoFe source material from the sputtering source 114 in form of Co ions and Fe ions, which may react with boron ions dissociated from the gas mixture, forming the CoFeB material on the substrate with desired boron concentration level. The bias power applied between the sputtering source 114 and the substrate support pedestal 108 maintains a plasma formed from the gas mixture in the process chamber 100. The ions mainly from the gas mixture in the plasma bombard and sputter off material from the sputtering source 114. The gas mixture and/or other process parameters may be varied during the sputtering deposition process, to form the top buffer layer 420 with desired film properties for different film quality requirements.

During processing, several process parameters may be regulated. In one embodiment, a RF source power may be supplied between about 100 Watts and about 20000 Watts. A RF bias power may be applied to the substrate support between about 50 Watts and about 5000 Watts. The substrate temperature may be maintained between about 150 degrees Celsius and about 450 degrees Celsius.

In one example, another metal material (not shown) may be optionally disposed below or above the top buffer layer 420 as needed, the metal material is selected from a group consisting of Ta, Mo, W and Cr.

At operation 312, after the top buffer layer 420 is formed, the top hardmask layer 422 is deposited on the top buffer layer 420. The top hardmask layer 422 is fabricated from CoFeB, MgO, Ta, W, Pt, CuBi, Mo, Ru, alloys thereof, or combinations thereof. The top hardmask layer 422 is disposed in the top buffer layer 420 and will be later utilized as an etching mask layer during the following patterning and/or etching process. After the top hardmask layer 422 is formed, a patterning process, e.g., an etching process, is performed to pattern the hardmask layer 422 as well as the film layers underneath to form the magnetic tunnel junction (MTJ) structure 402.

Accordingly, processes and apparatus of forming MTJ device structures for MRAM are provided. In one example, the MTJ structure has a top buffer layer disposed on a metal capping layer on a dielectric capping layer in the MTJ structure. The top buffer layer is an amorphous layer and is a non-magnetic material. One example of the top buffer layer is a boron doped CoFe material (e.g., a CoFeB layer). Furthermore, after a dielectric capping layer is formed in the MTJ structure, a cooling process is performed on the dielectric capping layer so as to enhance and control the lattice structure of the metal capping layer subsequently formed thereon While the foregoing is directed to embodiments of the disclosure, other and further embodiments of the disclosure may be devised without departing from the basic scope thereof.

What is claimed is:

1. A magnetic tunnel junction device structure, comprising:
   a substrate;
   a seed layer disposed on the substrate;
   a pinning layer disposed on the seed layer, the pinning layer comprising a first pinning layer and a second pinning layer sandwiching a coupling layer, wherein the first pinning layer, the second pinning layer, or both comprise Co and Ni;
   a junction structure disposed on the seed layer, the junction structure comprising a first ferromagnetic layer and a second ferromagnetic layer sandwiching a tunneling barrier layer;
   a dielectric capping layer disposed on the junction structure;
   a metal capping layer disposed on the dielectric capping layer; and
   a top buffer layer disposed on the metal capping layer.

2. The magnetic tunnel junction device structure of claim 1, wherein the top buffer layer is amorphous.

3. The magnetic tunnel junction device structure of claim 1, wherein the top buffer layer is non-magnetic.

4. The magnetic tunnel junction device structure of claim 1, wherein the top buffer layer is a dielectric material, a metal material, or an insulating material with or without metal dopants.

5. The magnetic tunnel junction device structure of claim 1, wherein the top buffer layer comprises a CoFeB material.

6. The magnetic tunnel junction device structure of claim 5, wherein the CoFeB material of the top buffer layer has a boron concentration by atomic weight between about 20% and about 40%.

7. The magnetic tunnel junction device structure of claim 5, further comprising a metal material disposed below or above the top buffer layer, the metal material being selected from a group consisting of Ta, Mo, W and Cr.

8. The magnetic tunnel junction device structure of claim 1, further comprising:
   a blocking layer disposed between the seed layer and the pinning layer.

9. The magnetic tunnel junction device structure of claim 1, wherein the metal capping layer is Ru, Ir, a combination thereof, or an alloy thereof.

10. A magnetic tunnel junction device structure, comprising:
    a junction structure disposed on a substrate, the junction structure comprising a first ferromagnetic layer and a second ferromagnetic layer sandwiching a tunneling barrier layer;
    a dielectric capping layer disposed on the junction structure;
    a metal capping layer disposed on the dielectric capping layer;
    a metal material disposed on the metal capping layer, the metal material selected from a group consisting of Ta, Mo, W, and Cr; and
    a top buffer layer disposed on the metal material, the top buffer layer comprising a CoFeB material.

11. The magnetic tunnel junction device structure of claim 10, further comprising:
    a seed layer disposed on the substrate; and
    a pinning layer disposed on the seed layer below the junction structure, the pinning layer comprises a first pinning layer and a second pinning layer sandwiching a coupling layer.

12. The magnetic tunnel junction device structure of claim 11, wherein the seed layer comprises Cr, Pt, or a combination thereof.

13. The magnetic tunnel junction device structure of claim 12, wherein when the seed layer comprises Cr, the first pinning layer comprises Co and Ni.

14. The magnetic tunnel junction device structure of claim 12, wherein the first pinning layer comprises:
    Co and Pt; or
    Co and Ni.

15. A magnetic tunnel junction device structure, comprising:
    a substrate;
    a seed layer disposed on the substrate;
    a pinning layer disposed on the seed layer, the pinning layer comprising a first pinning layer and a second pinning layer sandwiching a coupling layer, wherein the first pinning layer, the second pinning layer, or both comprise Co and Ni;
    a junction structure disposed on the seed layer, the junction structure comprising a first ferromagnetic layer and a second ferromagnetic layer sandwiching a tunneling barrier layer;
    a dielectric capping layer disposed on the junction structure;
    a metal capping layer disposed on the dielectric capping layer; and
    a top buffer layer disposed on the metal capping layer, the top buffer layer comprising a CoFeB material.

16. The magnetic tunnel junction device structure of claim 15, further comprising a metal material disposed on the metal capping layer and disposed below the top buffer layer, the metal material selected from a group consisting of Ta, Mo, W and Cr.

17. The magnetic tunnel junction device structure of claim 15, wherein the metal capping layer is Ru, Ir, a combination thereof, or an alloy thereof.

* * * * *